United States Patent [19]

Komeyama

[11] Patent Number: 4,614,431

[45] Date of Patent: Sep. 30, 1986

[54] ALIGNMENT APPARATUS WITH OPTICAL LENGTH-VARYING OPTICAL SYSTEM

[75] Inventor: Yoshihiro Komeyama, Yokohama, Japan

[73] Assignee: Hitachi, Ltd., Tokyo, Japan

[21] Appl. No.: 580,709

[22] Filed: Feb. 16, 1984

[30] Foreign Application Priority Data

Feb. 18, 1983 [JP] Japan ................................. 58-24552
Feb. 21, 1983 [JP] Japan ................................. 58-26154
May 30, 1983 [JP] Japan ................................. 58-94017

[51] Int. Cl.$^4$ ............................................. G01B 11/00
[52] U.S. Cl. ................................. 356/401; 356/400
[58] Field of Search ............... 356/400, 401; 355/53, 355/57, 63; 250/491.1, 492.1, 548; 350/500; 378/34

[56] References Cited

U.S. PATENT DOCUMENTS 3,775,012  11/1973  Ling et al. ........................... 356/400

FOREIGN PATENT DOCUMENTS 0138464  11/1976  Japan .
0126243  10/1977  Japan .

*Primary Examiner*—R. A. Rosenberger
*Assistant Examiner*—Crystal Cooper
*Attorney, Agent, or Firm*—Antonelli, Terry & Wands

[57] ABSTRACT

In an aligner system wherein a mask and a wafer are arranged so as to oppose each other with a predetermined gap therebetween, an alignment apparatus is provided including an objective for focusing an alignment marks formed on the mask and on the wafer, a photodetector for imaging both alignment marks, an optical length-varying optical system, a displacement detector, a magnification compensation arrangement, and a relative displacement magnitude detector. The optical length-varying optical system includes at least one prism arrangement for changing an optical length of the optical system to bring each of the alignment marks into focus. The optical system enables light rays from the alignment marks to enter the at least one prism arrangement an even number of times and to exit from the at least one prism arrangement an even number of times, so that the first entrance of the light rays to the at least one prism arrangement and the last exit of the light rays from the at least one prism arrangement may be shifted. The first entrance of the light rays includes optical images from the objective with the last exit of the light rays being directed toward the photodetector. The displacement detector detects the magnitude of movement of the at least one prism and the magnification compensation arrangement compensates for magnitudes of the displacements of the respective alignment marks from an optic axis whereby relative displacement magnitude between the mask and the wafer are detected by use of the images of equal magnifications and the mask and wafer can be aligned with high sensitivity and high accuracy.

8 Claims, 27 Drawing Figures

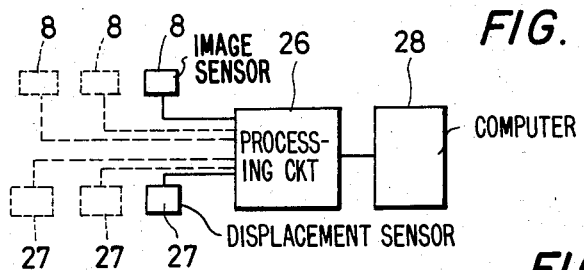
FIG. 8
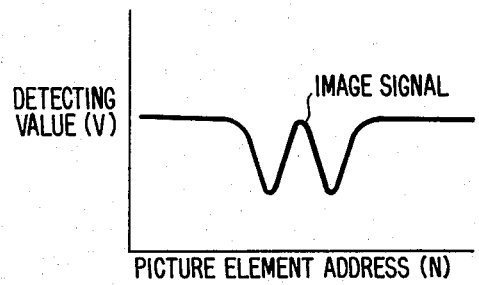
FIG. 9
FIG. 10(A)
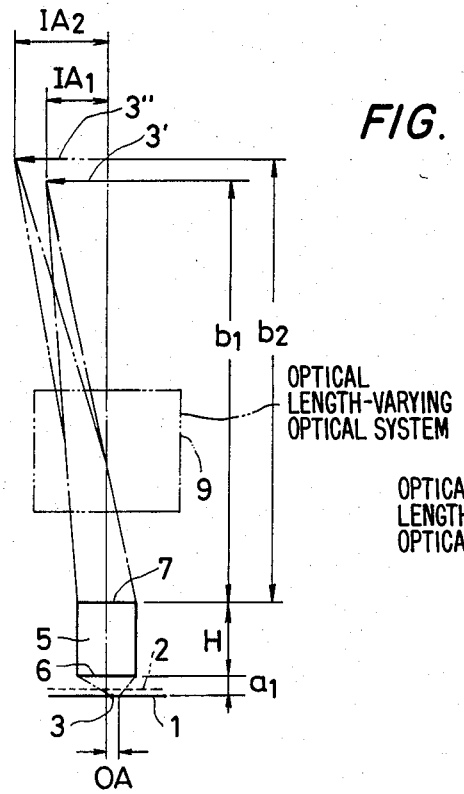
FIG. 10(B)
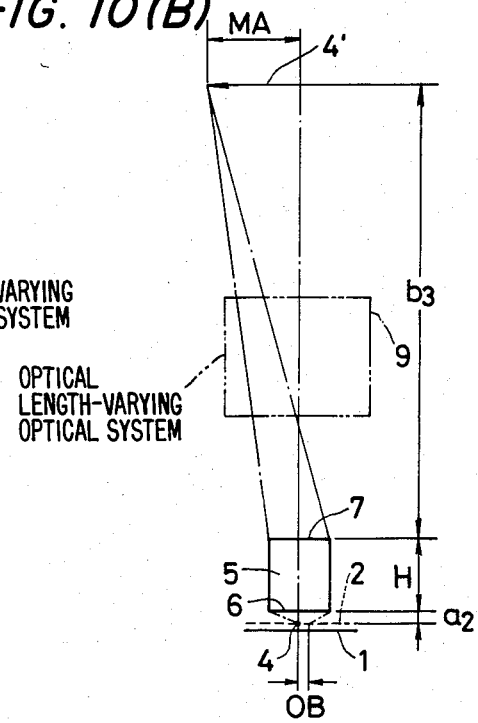

ALIGNMENT APPARATUS WITH OPTICAL LENGTH-VARYING OPTICAL SYSTEM

BACKGROUND OF THE INVENTION

The present invention relates to an alignment apparatus in an X-ray aligner system etc., in which a mask and a wafer have their relative positions detected in a focused state and are aligned.

A relative position detection apparatus including a dual focus optical system, for use in a proximity aligner system in which a wafer and a mask are exposed to light with a minute clearance or gap therebetween, has heretofore been known from Japanese Laid-open Patent Application No. 51-138464 or Japanese Laid-open Patent Application No. 52-126243. FIG. 1 shows a case where such known relative position detection apparatus is applied to the aligner system.

Numeral 1 in FIG. 1 designates a wafer, which is provided on its surface with a pattern 1' and three alignment marks 3 as shown in FIG. 2(A).

Numeral 2 in FIG. 1 designates a mask, which is provided on its surface with a pattern surface 2' and three alignment marks 4 as shown in FIG. 2(B).

In the dual focus detection method illustrated in FIG. 1, the alignment marks 3 of the wafer 1 and those 4 of the mask 2 are focused on a sensor 8 as will be described in detail later, whereby the relative positions of the wafer 1 and the mask 2 are detected with the images of both the alignment marks 3 and 4 superposed on the sensor 8 as shown in FIG. 2(C). Illumination light emergent from a light source 10 is projected on the mask 2 and the wafer 1 via an illuminating optical system 11, a semitransparent mirror 12, a mirror 13 and an objective 5. Light rays reflected from the wafer 1 and the mask 2 pass through the objective 5, mirror 13 and semitransparent mirror 12 again and reach a beam splitter 14, by which the light rays are split into a light path 15 and a light path 16.

Here, the light path 15 is a light path for focusing the alignment marks 4 on the mask 2 onto the sensor 8, while the light path 16 is a light path for focusing the alignment marks 3 on the wafer 1 onto the sensor 8.

The light path 16 is provided with a magnification compensating lens 17 for equalizing the magnification of the alignment marks 3 on the wafer 1 to the magnification of the alignment marks 4 of the mask 2, and a mirror 18.

The light path 15, which is the light path for focusing the alignment marks 4 on the mask 2 onto the sensor 8, is folded in order to focus the alignment marks 3 and 4 of the wafer 1 and the mask 2 on the sensor. The light beam passes through a prism 20 for compensating its optical length and further through a mirror 21, to reach a beam splitter 19.

The light paths 15 and 16 are superposed by the beam splitter 19, and the real images of the alignment marks 3 and 4 of the mask 2 and the wafer 1 having the equal magnifications are formed at a first focusing point 22.

Herefrom, the images are further passed through a relay lens 23 so as to be focused on the sensor 8.

Meanwhile, in a case where this relative position detection apparatus including the dual focus optical system is applied to a soft X-ray aligner system, a positioning accuracy of within 0.1 μm is required. On the other hand, since a soft X-ray source is close to a point source, the circuit pattern on the mask can be printed on the wafer by enlarging or reducing it by changing the clearance between the wafer and the mask. By adjusting the clearance between the wafer and the mask, accordingly, the minute thermal expansion or contraction of the mask or wafer can be coped with, and the matching of patterns based on the joint use of the soft X-ray aligner system and a reduction projection aligner system (disclosed in U.S. Pat. No. 4,153,371) can be established. However, when the clearance between the mask and the wafer is adjusted as described above by moving either the mask or the wafer, the alignment marks become out of focus in the light path 15 or 16 and need to be brought into focus by moving the prism 20 etc. In a case where, in moving the prism 20 etc., this prism 20 has deviated laterally or inclined as illustrated in FIG. 3, the incident points of the light paths 15 and 16 on the sensor 8 disagree, resulting in the problem that the positioning accuracy mentioned above is not attainable.

As an expedient for solving this problem, Japanese Laid-open Patent Application No. 52-126243 discloses the use of a corner curb 20' as illustrated in FIG. 4. Here, symbol 14' denotes a semitransparent mirror, and symbols 18' and 21' denote reflectors. The expedient has the disadvantage that the corner curb 20' has three edges, which are observed and cannot be distinguished from the alignment marks of the mask and the wafer. Another disadvantage is that, since the semitransparent mirror 14' must be used, the quantities of light from the alignment marks of the mask and the wafer decrease to half, so the sensitivity lowers.

SUMMARY OF THE INVENTION

The present invention has for its object to eliminate the disadvantages of the prior arts and to provide an alignment apparatus in an X-ray aligner system etc. in which focusing optical lengths are varied in accordance with the clearance or gap between a mask and a wafer, and the relative displacement magnitudes of the mask and the wafer are detected at high sensitivity and high accuracy in a focused state, whereby the mask and the wafer can be precisely aligned.

The present invention for accomplishing the object is characterized, in an X-ray aligner system etc., in that at least one prism rectilinearly movable and in the shape of a right-angled triangle for changing optical lengths in accordance with the clearance between a mask and a wafer is disposed between an objective which serves to detect the images of the target marks of the mask and the wafer and a focusing position at which a photodetector is installed, light rays being reflected twice by each of the planes of the prism which are at an angle of 45 degrees to the moving direction of the prism, whereby the target marks of the mask and the wafer are successively focused on the photodetector with their deviations relative to an optic axis prevented and at high sensitivity without decreasing the quantities of the light, and the mask and the wafer have the relative displacement magnitudes thereof detected so as to be aligned.

Further, the present invention is characterized in that the movement magnitude of the prism is measured, on the basis of which the displacement magnitude from the optic axis, of the alignment mark detected by the photodetector is subjected to a magnification compensation, whereby the displacement magnitudes of the target mark of the mask and the alignment mark of the wafer are corrected to equal focusing magnifications.

The present invention is also characterized in that, using a positioning jig in which a reflective layer such as an aluminum evaporated film is formed on a substrate, a transparent layer such as a polyimide film is formed on the reflective layer, and optical detection patterns are formed on the transparent layer, the optical detection patterns and the virtual images thereof formed on the reflective layer are detected, whereby the magnitude of an error attributed to the inclination of the optic axis of a microscope objective is precisely measured so as to compensate for the displacement magnitudes of the respective target marks or to correct the inclination angle of the optic axis.

BRIEF DESCRIPTION OF THE DRAWINGS

FIGS. 6(A) and 6(B) are schematic arrangement diagrams showing an embodiment of the relative position detection apparatus according to the present invention, while

FIG. 8 is a diagram showing the schematic arrangement of a signal processor for alignment;

FIG. 9 is a diagram showing in correspondence with picture elements (N) an image signal waveform which is obtained from a photodetector constructed of a linear sensor;

FIGS. 10(A) and 10(B) are diagrams for explaining magnification compensations;

FIGS. 17 to 23 are diagrams for explaining a method according to the present invention for measuring the magnitude of an error attributed to the inclination of the optic axis of a microscope objective; wherein FIG. 17 is a perspective view showing a positioning jig, FIG. 18 is an enlarged vertical sectional view taken along line XVIII—XVIII in FIG. 17, FIGS. 19 and 20 are diagrams showing the states in which relative positions are detected with the positioning jig as to respective cases where the optic axes of microscope objectives are straight and at a slant, FIG. 21 is a partial enlarged diagram of the detection state, and FIGS. 22 and 23 are diagrams for explaining the operation of setting the width and interval of the detection patterns of the positioning jig.

DETAILED DESCRIPTION OF THE PREFERRED EMBODIMENTS

Figure 5:
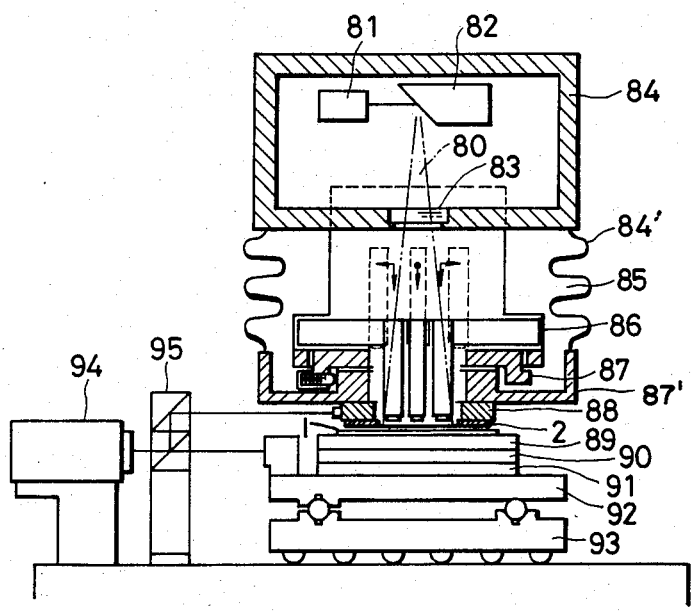
FIG. 5 is a schematic setup diagram showing an X-ray aligner system which includes a relative position detection apparatus according to the present invention.

An X-ray aligner system which includes a relative position detection apparatus according to the present invention will be described with reference to FIG. 5.

The X-ray aligner system comprises an X-ray generator 84 which has an electron gun 81, a target 82, and a window 83 made of beryllium for taking out a soft X-ray beam 80 produced from the target 82; and a gastight chamber 85 which is connected with the X-ray generator 84. At the lower end of the gastight chamber 85, there are disposed a Y-axial mask stage 87 which is supported so as to be slidable in a Y-axial direction, by a base 86 constituting the gastight chamber 85 and which is driven by piezoelectric elements by way of example; and an X-axial mask stage 87' which is supported so as to be slidable in an X-axial direction, by the Y-axial mask stage 87, which is driven by piezoelectric elements by way of example and whose lower end has a holding member 88 mounted thereon, this holding member serving to hold a mask 2 to be exposed to the X-rays. The base 86 can be vertically moved relative to the X-ray generator 84 so as to adjust the distance between the mask 2 and the target 82. A bellows 84' is provided to this end. In order to prevent the X-rays from attenuating, the interior of the gastight chamber 85 is filled up with helium gas under a pressure substantially equal to the atmospheric pressure.

Further, the X-ray aligner system comprises a wafer chuck 89 which holds by vacuum suction a wafer 1 opposing to the mask 2 with a gap of 10 μm—several tens μm therebetween, a vertical motion mechanism 90 which raises and lowers the whole wafer chuck 89 so as to adjust the gap between the mask 2 and the wafer 1, a $\theta$ stage 91 to which the vertical motion mechanism 90 is attached and which is constructed so as to be rotatable within a horizontal plane, a Y-axial wafer table 92 which is constructed so as to move the $\theta$ stage 91 in the Y-axial direction, and an X-axial wafer table 93 which is constructed so as to move the Y-axial wafer table 92 placed thereon, in the X-axial direction. Shown at numerals 94 and 95 are laser interferometers, which are disposed for measuring the position of the wafer 1 with reference to the mask 2 so as to expose the wafer 1 to the X-rays in step-and-repeat fashion. In case of the X-ray aligner system, a circuit pattern to be printed becomes as fine as 1 μm or less. Therefore, it becomes necessary to match the circuit pattern to the minute expansion or contraction of the mask or wafer attributed to thermal expansion or contraction. In addition, the circuit pattern needs to be printed by jointly using the X-ray aligner system and a reduction projection aligner system. In either case, the matching is possible owing to the point source of the radiation in the X-ray aligner system, in such a way that the general magnification at which the circuit pattern formed on the mask 2 is printed on the wafer 1 is enlarged or reduced by changing the gap between the mask 2 and the wafer 1. Besides, when the circuit pattern formed on the mask 2 is printed on the wafer 1, they need to be positionally matched in the horizontal direction. To this end, the relative position detection apparatus which can cope with the change of the gap between the mask 2 and the wafer 1 and which can align the mask and wafer at high precision is installed in the gastight chamber 85. Since the portion of a microscope objective in the relative position detection apparatus forms an obstacle in the exposure operation, it is constructed so as to be capable of advancing or retreating vertically and laterally.

Next, the relative position detection apparatus according to the present invention will be concretely described with reference to FIGS. 6(A) and 6(B).

Two prisms 42 and 46 are placed on and fixed to a carriage 48. Thus, the pair of prisms 42, 46, which may be porro prisms can move without changing their relative positions. An inverted prism 44 is fixed on the symmetrical line of the pair of prisms 42, 46.

Light rays respectively reflected from the wafer 1 and the mask 2 first enter the prism 42 through a semitransparent mirror 12, are reflected therein and exit therefrom; they have images reversed by the inverted prism 44 via a mirror 43; they enter the prism 46 through a mirror 45, are reflected therein and lastly exit therefrom; and they form real images at a first focusing point 22 via a mirror 47. Further, real images are formed on a sensor 8 by a relay lens 23 so as to perform position detection.

In this light path arrangement, owing to the provision of the inverted prism 44, the prism 42 and the prism 46 form light paths symmetric to each other. The light rays are reflected twice by these prisms 42 and 46, the first entrance and the last exit fall into a shifting relationship, and the light scarcely attenuates. The prisms 42, 46 are placed on the same carriage 48, and this carriage 48 is reciprocated as indicated by arrow F, whereby optical lengths can be altered.

With the above arrangement, the time-division dual detection is executed. In a case where the carriage 48 inclines in the direction of arrow (a) as shown in FIG. 6(A), the pair of prisms 42, 46 undergo rotations $\theta_2$ of equal magnitudes. Accordingly, optic axis deviations having developed in the rectangular prism 42 are reversed by the inverted prism 44 and then enter the prism 46, in which the optic axis deviations are canceled.

Figure 6A:
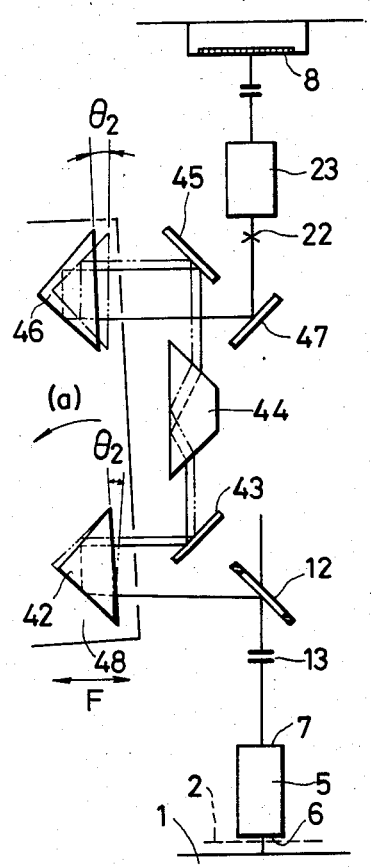
Figure 6B:
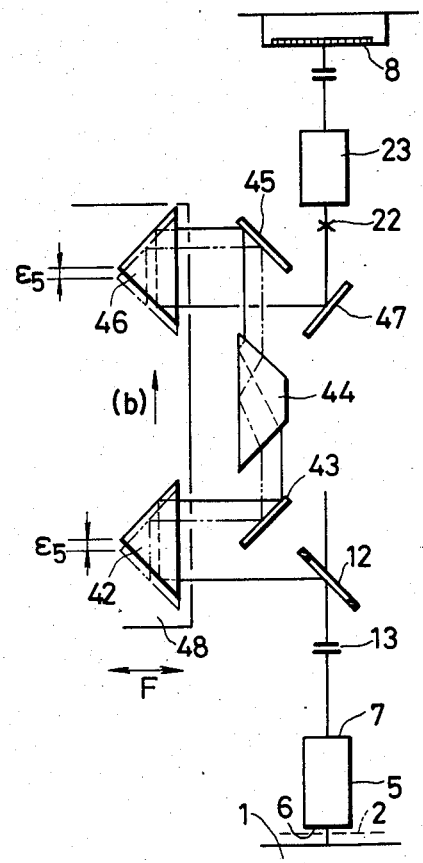

In a case where the carriage 48 deviates in the direction of arrow (b) as shown in FIG. 6(B), the prisms 42, 46 undergo lateral deviations $\epsilon_5$ of equal magnitudes, and these lateral deviations $\epsilon_5$ are canceled through the inverted prism 44.

As described above, even when the rotations in the direction of the arrow (a) or the lateral deviations in the direction of the arrow (b) have arisen in the case of changing the optical lengths by moving the carriage in the directions of the reciprocating arrow F, no optic axis deviation develops. Therefore, the relative positions of the mask and the wafer can be detected at high precision.

Figure 7:
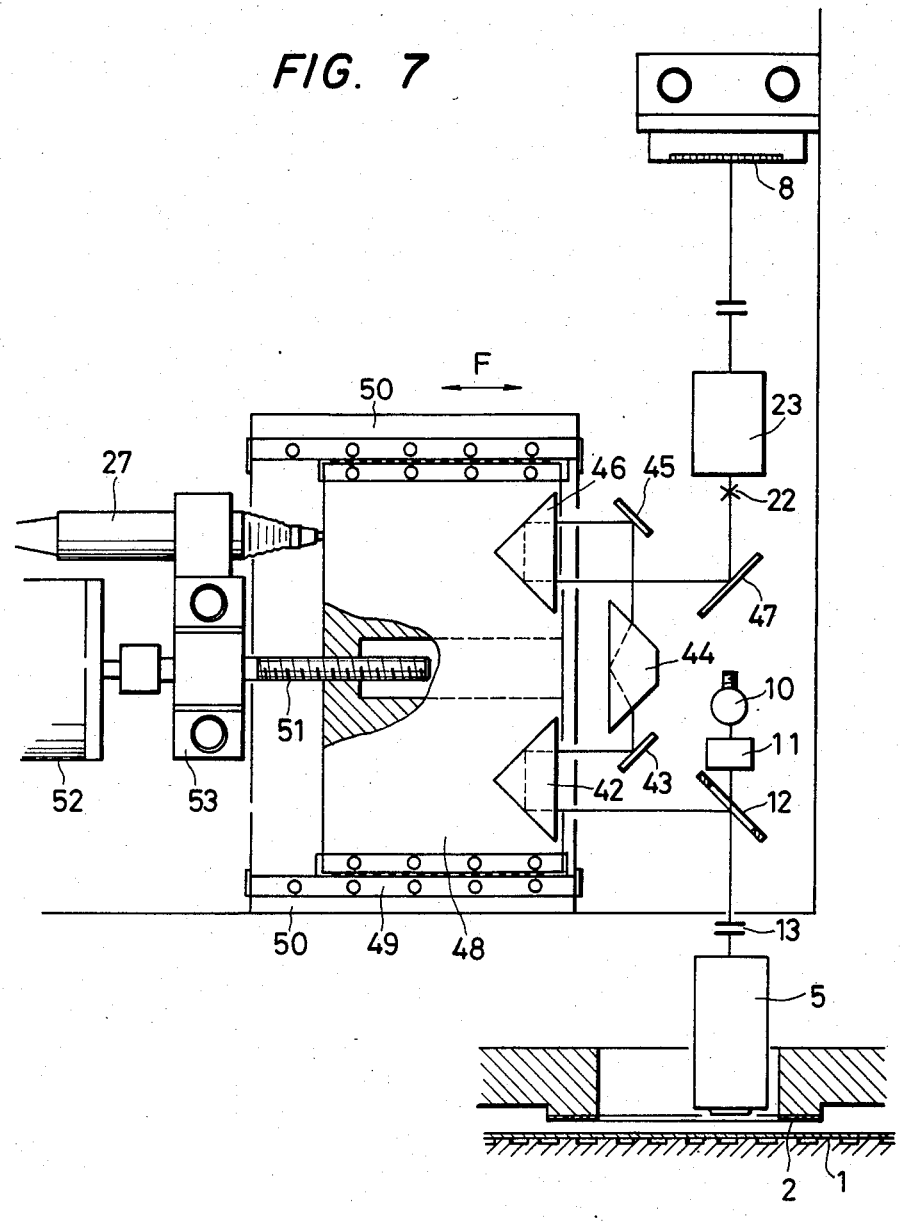
FIG. 7 is a diagram showing the embodiment in the concrete.

FIG. 7 is a light path diagram showing the arrangement of optical elements in the present embodiment. The prisms 42, 46 are fixed to the carriage 48, the carriage 48 and stationary members 50 are slidably supported by ball guides 49, and the carriage can be moved in the aforementioned slidable directions by a screw 51 and a driving motor 52.

The screw 51 is mounted on the stationary members in rotatable fashion by a holder 53.

The movement magnitude of the carriage 48 is detected by a sensor 27, and a magnification compensation is made by the use of the detected value. Then, the relative displacement magnitudes of the alignment mark of the mask and that of the wafer are detected, and the mask table or the wafer table is moved in the horizontal direction, thereby to positionally match the mask and the wafer.

More specifically, illumination light emitted from a light source 10 is projected on the mask 2 and the wafer 1 via an illuminating optical system 11, a semitransparent mirror 12, a mirror 13 and an objective 5.

The light rays reflected from the wafer 1 and the mask 2 pass through the objective 5 and the mirror 13 again, are bent by the semitransparent mirror 12, are reflected by the prism 42 and the mirror 43, and reach the inverted prism 44. Further, the light rays emergent from the inverted prism 44 reach the mirror 45 and then the prism 46. The pair of prisms 42 and 46 are movable in the directions of the reciprocating arrow F.

The light reflected by the prism 46 is reflected by the mirror 47, and forms the real image at the first focusing point 22. Further, the alignment marks 3 or the alignment marks 4 are imaged by the relay lens 23 on a photodetector 8 which is constructed of a self-scanned unidimensional linear image sensor such as a CCD.

The image to be formed on the photodetector 8 concerns the distance from the rear principal point 7 of the objective 5 to the first focusing point 22 (refer also to FIGS. 10(A) and 10(B). In a case where the wafer 1 is at a distance $a_1$ from the fore principal point 6 of the objective 5, the alignment marks 3 of the wafer 1 are imaged when the prisms 42 and 46 are moved so as to establish an optical length $b_1$. In contrast, in a case where the mask 2 is at a distance $a_2$ from the fore principal point 6 of the objective 5, the alignment marks 4 of the mask 2 are imaged when the prisms 42 and 46 are moved so as to establish an optical length $b_3$.

In order to image the respective alignment marks on the photodetector 8 in this manner, the movement magnitude $l_6$ of the prisms 42 and 46 becomes $(b_3-b_1)/4$.

First, while the prisms 42 and 46 are being moved near the position at which the optical length is $b_1$, the alignment marks 3 on the wafer 1 are imaged by the unidimensional linear image sensor 8. A processing circuit 26 shown in FIG. 8 performs the A/D (analog-to-digital) conversion of image signals obtained from respective picture elements (N) as shown in FIG. 9 where the abscissa a represents the picture element address (N) and the ordinate represents the detecting value (V), and executes the calculation of $$f = \sum_{N=1}^{100} |V(N) - V(N-1)|$$

as to the converted digital signals V(N). The focused position of the prisms 42 and 46 at which the value of the function f becomes the maximum is detected by the sensor 27, and it is stored in a memory within the processing circuit 26. Next, while the prisms 42 and 46 are being moved near the position at which the optical length is $b_3$, the alignment marks 4 on the mask 2 are imaged by the unidimensional linear image sensor 8. Likewise to the above, the processing circuit 26 shown in FIG. 8 performs the A/D conversion of image signals obtained from respective picture elements (N) as shown in FIG. 9, and executes the calculation of $$f = \sum_{N=1}^{100} |V'(N) - V'(N-1)|$$

as to the converted digital signals V'(N). The focused position of the prisms 42 and 46 at which the value of the function f' becomes the maximum is detected by the sensor 27, and it is stored in the memory within the processing circuit 26. On the other hand, the central position of the alignment mark 3 on the wafer 1 is obtained from the digital signal V(N) detected in the focused state, by the technique of symmetry pattern matching as disclosed in, for example, U.S. Pat. No. 4,115,762, whereupon the magnitude of displacement $IA_1$ between this central position and the optic axis is detected as shown in FIG. 10(A) where block 9 represents an optical length-varying optical system. Besides, the central position of the alignment mark 4 on the mask 2 is obtained from the digital signal V'(N) detected in the focused state, by the technique of the symmetry pattern matching as described above, whereupon the magnitude of displacement MA between this central position and the optic axis is detected as shown in FIG. 10(B). The optical length-varying optical system 9 includes the semitransparent mirror 12, prism 42, mirror 43, inverted prism 44, mirror 45, prism 46 and mirror 47 as illustrated in FIG. 7, for example.

The wafer 1 and the mask 2 have the gap therebetween, and are detected along the same light path. Therefore, the imaging magnification $m_1 = (IA_1)/(OA)$ of the alignment mark 3 of the wafer 1 and the imaging magnification $m_2 = (MA)/(OB)$ of the alignment mark 4 of the mask 2 are naturally unequal as shown in FIGS. 10(A) and 10(B).

In order to match it to the imaging magnification $m_2$ of the alignment mark 4 of the mask 2, the displacement magnitude $IA_1$ detected as described above is subjected to the magnification compensation in accordance with the following equation (1) by a computer 28 shown in FIG. 8, so as to calculate $IA_2$:

$$\frac{MA}{OB} = \frac{IA_2}{OA} = m_2/m_1 \times \frac{IA_1}{OA} = \frac{b_1 - f + 4 \times l_6}{b_1 - f} \times \frac{IA_1}{OA} \quad (1)$$

That is, the coefficient K of the magnification compensation is given by the following equation (2):

$$K = \frac{b_1 - f + 4 \times l_6}{b_1 - f} \quad (2)$$

where $b_1$ becomes known when the displacement magnitude of the prisms 42 and 46 has been detected by the sensor 27, f denotes the focal distance of the objective 5 and is known, and $l_6$ is obtained as described before.

When the table on which the mask is placed or the table on which the wafer is placed is moved so as to equalize the magnification compensated value $IA_2$ and the displacement value MA in this way, the mask and the wafer can be positionally matched. The reasons why the magnification must be compensated are that both the center of the alignment mark of the wafer and the center of the alignment mark of the mask do not always lie on the optic axis, and that the prisms 42 and 46 are moved in accordance with the gap formed between the mask and the wafer.

Since, as described above, f is known and $b_1$ and $l_6$ are detected, the gap ($a_1$-$a_2$) between the wafer 1 and the mask 2 can also be obtained by Equation (3) given below. In the case of the X-ray aligner system, it is to be understood that the measurement of the gap may well be performed as described in U.S. patent application Ser. No. 387,206 now U.S. Pat. No. 4,475,223.

$$a_1 - a_2 = \frac{1}{\left(\frac{1}{f} - \frac{1}{b_1}\right)} - \frac{1}{\left(\frac{1}{f} - \frac{1}{b_1 + 2 \times l_6}\right)} \quad (3)$$

As described above, the prisms 42 and 46 are moved in accordance with the gap between the mask 2 and the wafer 1 so as to detect the respective alignment marks in the focused state, and the magnification compensation is made in aligning the mask and the wafer. As a result, the mask and the wafer can be accurately aligned even when the centers of the alignment marks deviate from the optic axis. The deviations of the optical images do not occur with respect to the inclination (a) and the lateral deviation (b) involved in moving the prisms 42 and 46, and when the alignment apparatus includes the reflecting optical system as described, so that the mask and the wafer can be aligned at high reliability without decreasing the quantity of light.

Besides the embodiment shown in FIGS. 6(A) and 6(B) and FIG. 7, an embodiment illustrated in FIGS. 11 to 14 can achieve similar functional effects. In this embodiment, alignments in the directions of X-, Y- and θ-axes are performed by detecting optical systems 51, 52 and 53 respectively. Among the detecting optical systems 51, 52 and 53 having the same arrangements, that 51 will be described in detail.

Illumination light 56 from a light source 54 having passed through an optical fiber 55 is condensed by a condensing lens 57. Via a mirror 58, a semitransparent prism 12 and a mirror 13, the light advances from a microscope objective 5 to a mask 2 along arrows indicated by broken lines in FIG. 11. It passes through the mask 2 whose base is substantially transparent, and it is projected into the vicinity of an alignment mark on a wafer 1.

Figure 11:
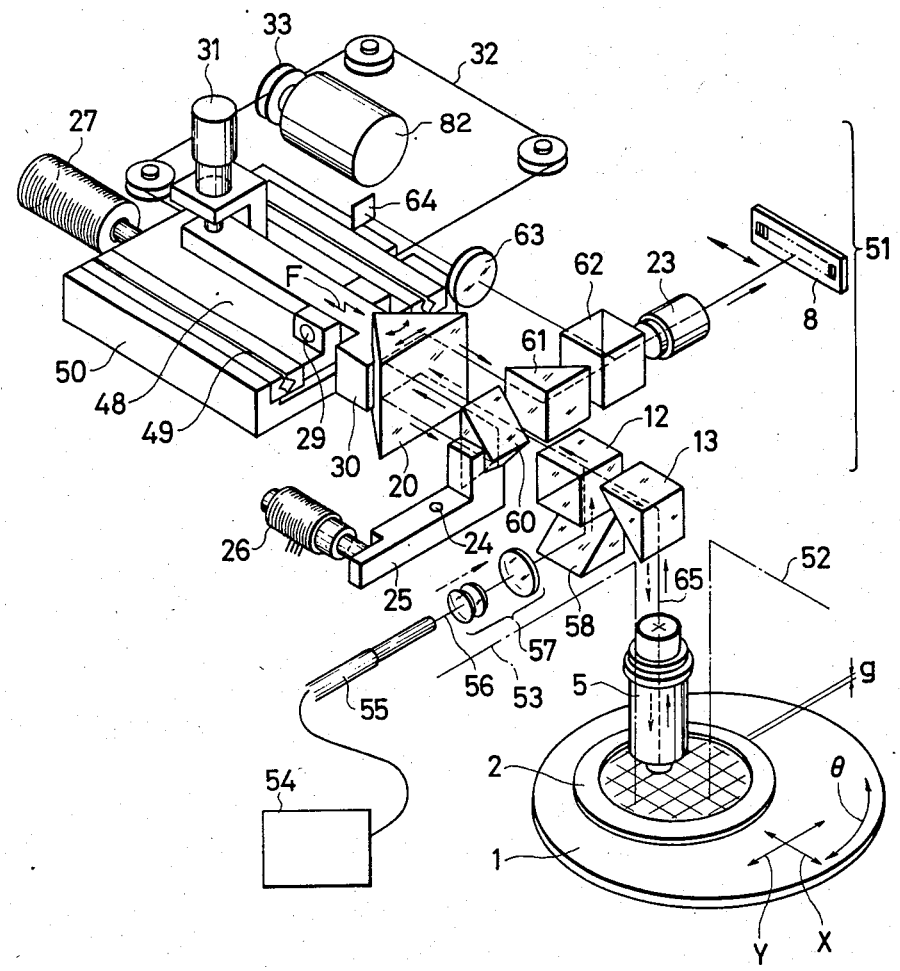
FIG. 11 is a diagram showing another embodiment of the relative position detection apparatus different from the embodiment of FIGS. 6(A) and 6(B) and 7.

Light rays reflected from the mask 2 and the wafer 1 pass through the microscope objective 5 again, and pass through the mirror 13 and the semitransparent prism 12 along arrows indicated by solid lines in FIG. 11. They first enter a prism 20, are reflected therein and exit therefrom; they are shifted by a prism 60; and they pass through the prism 20 again while forming a light path symmetric to the previous light path. Owing to the light path formation, an imaging error correction based on the movement of the prism 20 is performed.

The light having lastly exited from the prism 20 is reflected by a mirror 61, and is split into two light paths by a semitransparent prism 62.

One light path split passes through a relay lens 23, and forms an image on a linear sensor 8.

The other light path split passes through a relay lens 63 and forms an image on a TV imaging screen 64, the image being utilized for visual observation.

The kind of the image to be formed depends upon the optical length from the microscope objective 5 to the linear sensor 8 or the TV imaging screen 64.

Therefore, the prism 20 is moved as indicated by arrow F, to change the optical length to any desired value and to form the image of the alignment mark of the mask 2 or the wafer 1 on the linear sensor 8, whereupon each position is detected.

Figure 1:
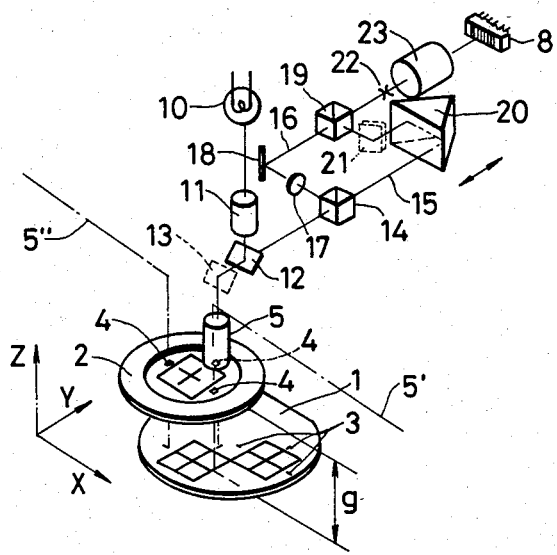
FIG. 1 is a perspective view showing an example of a prior-art relative position detection apparatus.
Figure 2A:
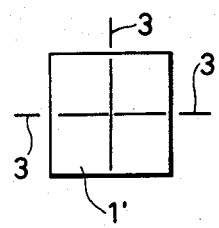
FIG. 2(A) is a diagram showing an exposure region and alignment marks on a wafer.
Figure 2B:
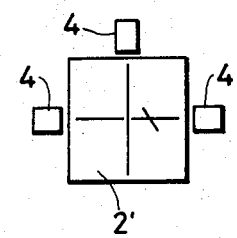
FIG. 2(B) is a diagram showing a circuit pattern and alignment marks formed on a mask.
Figure 2C:
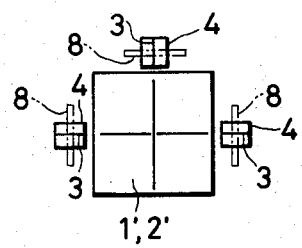
FIG. 2(C) is a diagram showing the state in which they are superposed.
Figure 3:
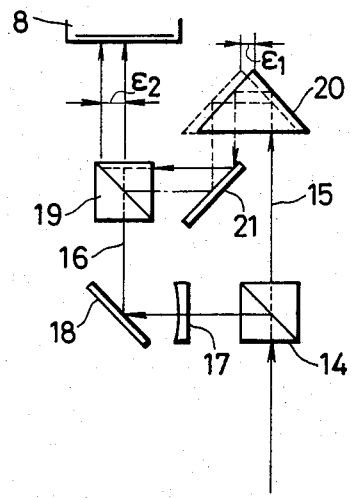
FIG. 3 is a diagram for explaining the problem of an optical system shown in FIG. 1.
Figure 4:
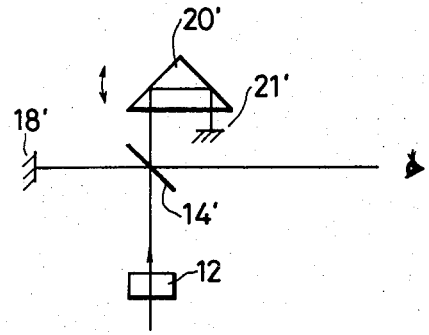
FIG. 4 is a diagram showing the schematic setup of a prior-art relative position detection apparatus which has solved the problem illustrated in FIG. 3.

The embodiment shown in FIG. 11 is such that the prisms 42 and 46 shown in FIG. 7 are juxtaposed vertically and made unitary. Even when the corresponding prism 20 has inclined minutely in a direction (a) or has moved finely in a direction (b), the deviations of the optical image can be canceled and prevented because the light ray is reflected twice by the upper and lower parts of the prism 20. Moreover, since the optical system is entirely reflective, decrease in the quantity of light is prevented and the alignment marks of both the mask and the wafer can be detected at high sensitivity, unlike the prior art illustrated in FIG. 4. The prsim 60 is held on a prism holder 25 which is turnably supported by a pin 24. The prism holder 25 can be finely turned and adjusted by a micrometer 26. Accordingly, the inclination of the prism 60 can be adjusted. The prism 20 is similarly held on a prism holder 30 which is supported so as to be turnable about a pin 29 disposed on a carriage 48. This prism holder 30 can be finely turned and adjusted by a micrometer 31 which is disposed on the carriage 48. Accordingly, the inclination adjustment of the prism 20 is possible. Shown at numeral 32 is a wire, one end of which is fixed to the carriage 48 and the other end of which is wound on a pulley 33 attached to the output shaft of a motor 82. Thus, the carriage 48 can be moved in the F directions by driving the motor 82. A sensor 27 serves to detect the displacement magnitude of the carriage 48, and is constructed of a differential transformer or the like.

Figure 12:
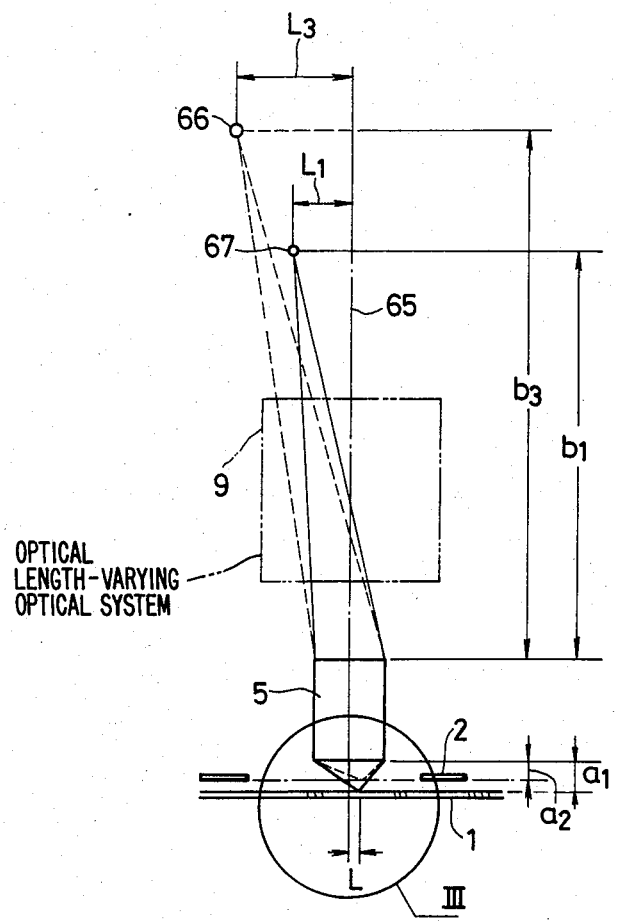
FIG. 12 is a diagram showing the principle of relative position detection.
Figure 13:
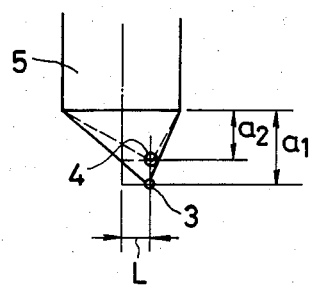
FIG. 13 is an enlarged diagram of a part III in FIG. 12.

Next, the principle of detecting the respective alignment marks will be described with reference to FIGS. 12 and 14 wherein the optical length-varying optical system 9 includes the mirror 13, semitransparent mirror 12, prism 60, prism 20, and the mirror 61 as illustrated in FIG. 11, for example.

The alignment mark 4 of the mask 2 at a distance $a_2$ from the microscope objective 5 forms its image 66 at a distance $b_3$ from the microscope objective 5. In addition, the alignment mark 3 of the wafer 1 at a distance $a_1$ from the microscope objective 5 forms its image 67 at a distance $b_1$ from the microscope objective 5. The alignment mark images 66 and 67 of the mask 2 and wafer 1 are respectively formed on the linear sensor 8 by changing the optical length through the movement of the prism 20 described above, whereupon the positions of the mask and wafer are detected.

According to the imaging law of optical lenses, however, the magnification of the images formed on the linear sensor 8 are unequal.

For this reason, the relative positions of the mask 2 and wafer 1 are evaluated in such a way that the imaging magnification difference $$\left( \frac{b_3}{a_2} \bigg/ \frac{b_1}{a_1} \right)$$

of the alignment mark images 66 and 67 of the mask 2 and wafer 1 is multiplied by the distance ($L_1$) from an optic axis 65 being an axis whose imaging position does not change even when the magnification has changed, to the place in which the alignment mark image 67 of the wafer 1 is formed $$\left\{ L_1 \times \left( \frac{b_3}{a_2} \bigg/ \frac{b_1}{a_1} \right) \right\}.$$

Here, $L_1 = lA_1$.

Figure 14:
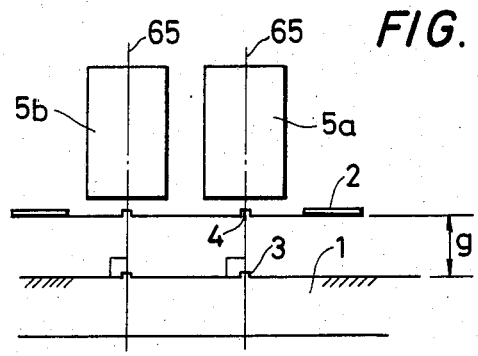
FIGS. 14 and 15 are diagrams showing relative position detections in the cases where the optic axes of microscope objectives are straight and slant, respectively.

Originally, in the detection of the relative positions of the mask 2 and wafer 1, it is clear that accurate relative positions cannot be found unless, as illustrated in FIG. 14, the mask 2 and the wafer 1 are arranged in parallel so that the optic axes 65 of microscope objectives $5a$ and $5b$ may be formed on perpendiculars to the mask 2 and the wafer 1.

Figure 15:
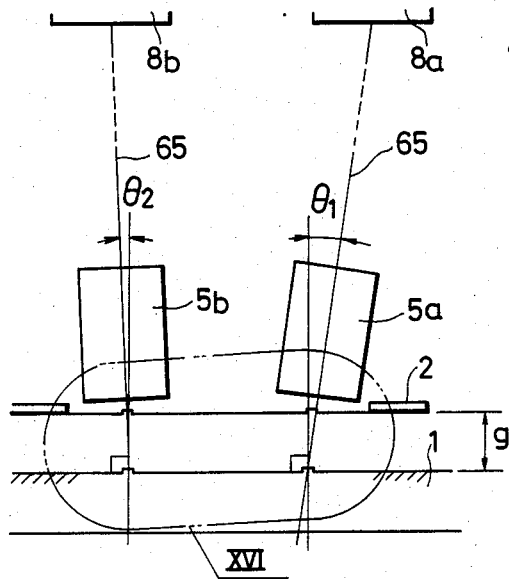
Figure 16:
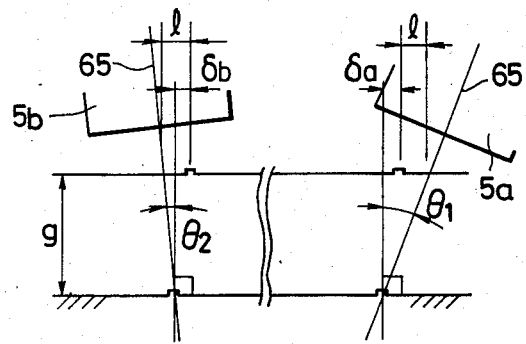
FIG. 16 is an enlarged diagram of a part VI in FIG. 15.

In actuality, however, it is difficult to accurately set the optic axes 65 of the plurality of microscope objectives $5a$ and $5b$ so as to be perpendicular to the mask 2 and wafer 1, and it is the situation to use the objectives as inclined as shown in FIGS. 15 and 16.

At this time, detection errors $\delta_a$ and $\delta_b$ attributed to the inclined microscope objectives $5a$ and $5b$ can be respectively expressed with quantities indicated in FIGS. 15 and 16, with the condition that a distance between the target marks of the mask 2 is equal to a distance between the target marks of the wafer 1, by the following:

$$\delta = g \cdot \tan \theta_1 - l$$

or $$\delta = g \cdot \tan \theta_2 - l$$

Here, $$l_x = \frac{g \cdot (\tan \theta_1 + \tan \theta_2)}{2}$$

In FIG. 15, symbols $8a$ and $8b$ denote linear sensors.

A method of accurately measuring the error magnitude attributed to the inclination of the optic axis of the microscope objective 5 in this manner will be concretely described with reference to FIGS. 17 to 23.

Figure 17:
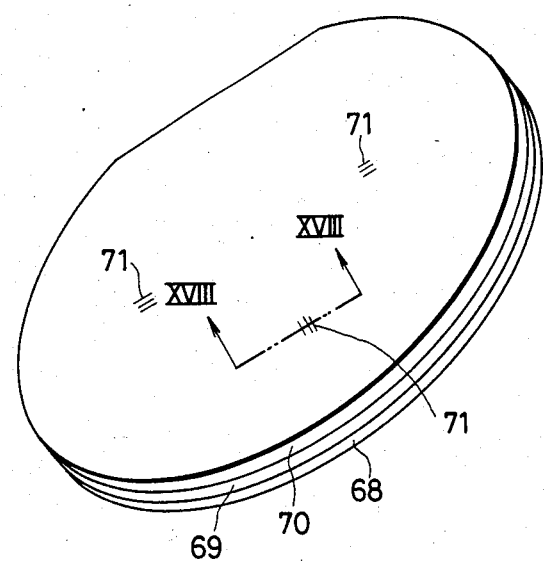
Figure 18:
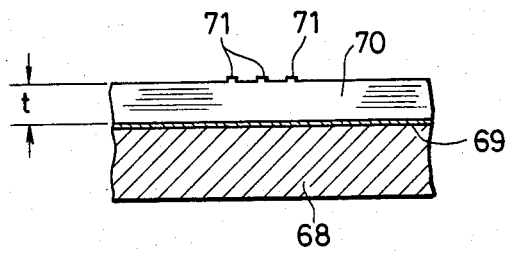

FIG. 17 shows a positioning jig which serves as the reference of the relative positioning between the mask 1 and the wafer 2.

The positioning jig for use in the present invention comprises a reflective layer 69 formed on a substrate 68 being a mirror wafer, a transparent layer 70 formed on the reflective layer 69, and optical detection patterns (hereinbelow, termed "detection patterns") 71 formed on the transparent layer 70.

The reflective layer 69 is provided by depositing an aluminum evaporated film or the like.

The transparent layer 70 is provided in such a way that a polyimide film or the like being a transparent member is stuck on the reflective layer 69 by spin coating. The thickness of the film by the spin coating is substantially determined by the viscosity of a coating agent and the spinning freuqency thereof, and only about 0.8–1 $\mu$m can be applied by one coating. Therefore, the coating agent is dividedly applied several times. In general, the dispersion of film thicknesses due to the spin coating is about 0.01 $\mu$m, and it poses no problem even when the film is dividedly applied several times. The relationship between the thickness t of the transparent layer 70 and the gap g of the mask 2 and wafer 1 can be expressed by the following equation:

$$t = (n \cdot g)/2$$

where n . . . refractive index of the transparent layer (polyimide film).

In general, in the X-ray aligner system employing a point light source, the gap g between the mask 2 and the wafer 1 is set at about 5–40 $\mu$m in view of the problem of blurring. In addition, the refractive index n of the polyimide film as the transparent layer 70 is about 1.5. In the case of the polyimide film, therefore, the thickness t of the transparent layer 70 is often made 3.75–40 μm in accordance with the calculation based on the above equation.

In this embodiment, as shown in FIG. 17, the detection patterns 71 are provided on three places of the transparent layer 70, and the detection patterns 71 numbering three are arrayed in each of the places. In addition, the detection patterns 71 can be formed by substantially the same process as an LSI production process. Next, the dimensions of the detection patterns 71 will be described.

Figure 22:
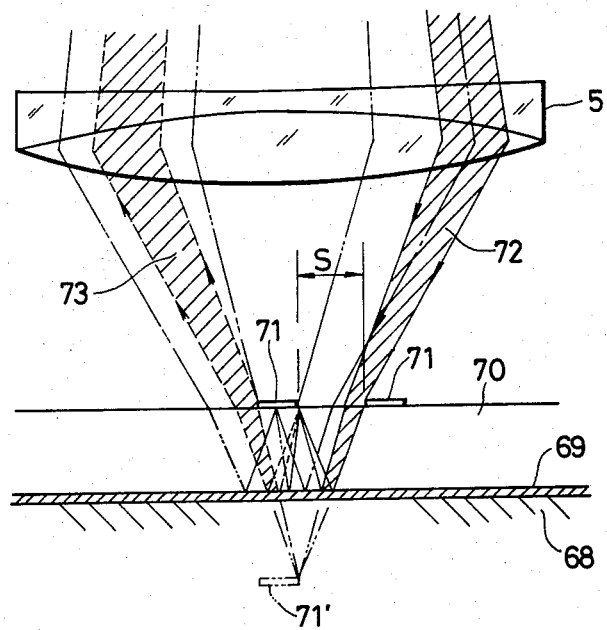

In order to detect the rear surface of the detection pattern 71 (the surface at which the detection pattern 71 lies in contact with the transparent layer 70) by the falling illumination with the microscope objective 5, it is required that, as illustrated in FIG. 22, illumination light 72 from the microscope objective 5 be reflected by the reflective layer 69, and subsequently reflected by the detection pattern 71, whereupon reflected light 73 reflected again by the reflective layer 69 return to the microscope objective 5. However, when the width w of the detection pattern 71 is too great, there arises the problem that the light once reflected by the rear surface of the detection pattern 71 returns to the rear surface of the detection pattern 71 again and does not return to the microscope objective 5, and hence, the detection pattern cannot be detected. Therefore, the width w of the detection pattern 71 and the spacing s between the adjacent detection patterns 71 must be set in appropriate ranges.

Figure 23:
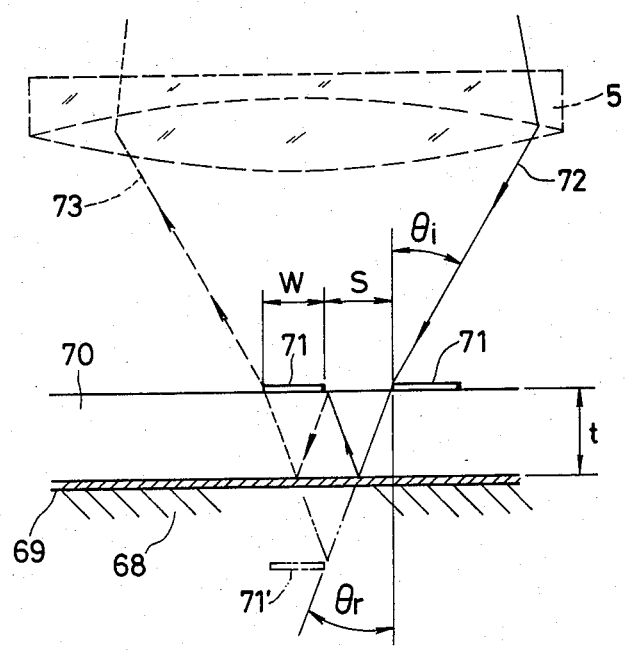

The maximum value of the width w of the detection pattern 71 is determined by the thickness t and refractive index n of the polyimide film being the transparent layer 70 and the numerical aperture NA of the microscope objective 5 as illustrated in FIG. 23, and it can be obtained by the following equation:

$$w = 2 \cdot t \cdot \tan(\sin^{-1}(NA/n))$$

Besides, the minimum spacing s between the adjacent detection patterns 71 can be obtained by an equation similar to the equation for obtaining the maximum width w of the detection pattern 71:

$$s = 2 \cdot t \cdot \tan(\sin^{-1}(NA/n))$$

However, in a case where the width of the detection pattern 71 is sufficiently small, the detection is possible even when the spacing between the adjacent detection patterns 71 has a value smaller than the minimum spacing s obtained.

Next, the reflection factor of the detection pattern 71 will be described.

When the positioning jig for use in the present invention is detected by the falling illumination, almost all the illumination light 72 is reflected by the reflective layer 69, to return to the microscope objective, so that an area inside the field of view becomes very bright. In order to bestow a contrast, accordingly, a pattern close to black having a small reflection factor is required as the detection pattern 71. For this reason, the detection pattern 71 is made of chromium oxide by way of example.

The three detection patterns 71 in one place are arranged at a position where they can be detected once by the microscope objective 5 which is installed in a predetermined position.

Figure 19:
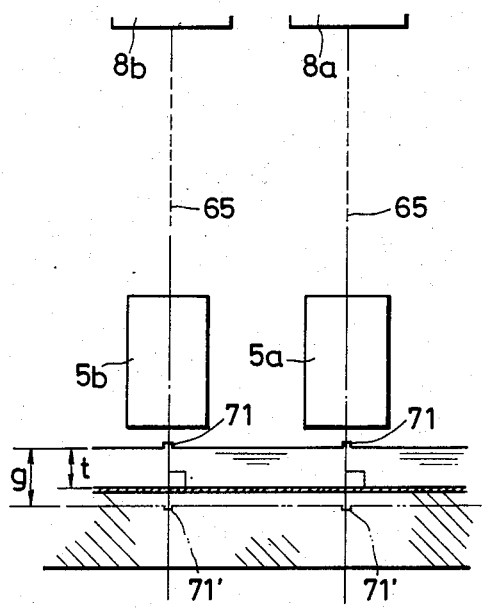
Figure 20:
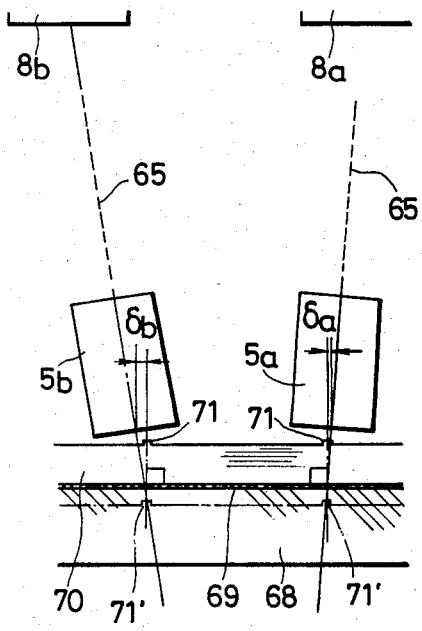
Figure 21:
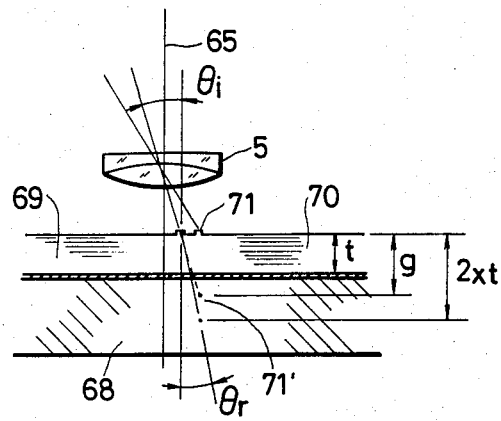

When the positioning jig is detected by the microscope objectives 5a and 5b as shown in FIGS. 19, 20 and 21, the detection patterns 71 of real images corresponding to the alignment marks 4 of the mask 2 and the detection patterns 71' of virtual images corresponding to the alignment marks 3 of the wafer 1 can be detected just in the state in which the mask 2 and the wafer 1 are relatively positioned ideally with the gap g therebetween.

At this time, as illustrated in FIG. 20, it is possible to detect the magnitudes of deviations $\delta_a$ and $\delta_b$ between the optic axis whose imaging position does not change even when the magnification (optical length) has changed, and the optic axes 65 which connect the detection patterns 71 of the real images and those 71' of the virtual images detected by the microscope objectives 5a and 5b.

These detection values are error magnitudes which are incurred by the inclinations of the optic axes 65 of the respective microscope objectives 5a and 5b.

In case of relatively positioning the mask 2 and the wafer 1 actually after the detection of the deviation magnitudes $\delta_a$ and $\delta_b$, these deviation magnitudes $\delta_a$ and $\delta_b$ are compensated for the detected values of the respective alignment marks 4 and 3 by, e.g., calculation or a method of changing the inclination angles of the optic axes, whereby the relative positioning of high precision can be realized.

In FIGS. 19 and 20, symbols 8a and 8b denote linear sensors.

The materials of the substrate 68, reflective layer 69 and transparent layer 70 of the positioning jig are not restricted to those in the embodiment, and the number of the detection patterns 71 is not restricted to that in the embodiment, either.

In this manner, according to the present embodiment, an error magnitude ascribable to the inclination of the optic axis of a microscope objective is measured using a positioning jig wherein a reflective layer is formed on a substrate, a transparent layer is formed on the reflective layer, and detection patterns are formed on the transparent layer. This brings forth the effect that the error magnitude can be accurately measured. Since compensations can be made in the actual positioning between two objects by grasping such error magnitudes, there is the derivative effect that relative positioning of high precision can be realized.

As set forth above, the present invention can achieve the effect that the magnitude of relative displacement between the alignment mark of a mask and the alignment mark of a wafer can be accurately detected without decreasing the quantities of light from the alignment marks and in correspondence with the change of the gap between the mask and the wafer, so the mask and the wafer can be aligned at high precision.

I claim:

1. In an aligner system wherein a mask and a wafer are arranged so as to oppose each other with a predetermined gap therebetween, an alignment apparatus comprising:

an objective for focusing an alignment mark formed on the mask and an alignment mark formed on the wafer;

a photodetector for imaging both of the alignment marks;

an optical length-varying optical system including at least one prism means disposed for rectilinear movement along a guide between the objective and a focusing position so as to change an optical length of the optical system and to bring each of the alignment marks into focus, the optical system enabling light rays from the alignment marks to enter the at least one prism means an even number of times and to exit from the at least one prism means an even number of times so that the first entrance of the light rays to the at least one prism means and the last exit of the light rays from the at least one prism means may be shifted, the first entrance of the light rays including optical images from the objective and the last exit of the light rays being directed toward the photodetector;

a displacement detecting sensor for detecting a magnitude of the movement of the at least one prism means of the optical length-varying optical system;

magnification compensation means for compensating magnitudes of displacements of the respective alignment marks detected by the photodetector, from an optic axis by calculation based on the movement magnitude of the at least one prism means detected by the displacement detecting sensor, the optical length and a focal distance of the objective, so as to equalize magnifications of the images; and means to detect a relative displacement magnitude between the mask and the wafer by the use of the images of the equal magnifications compensated by the magnification compensation means;

whereby the mask and the wafer are aligned by movement thereof.

2. An alignment apparatus according to claim 1, wherein the at least one prism means comprises first and second prisms, the second prism reflecting light rays on two planes thereof for enabling shifting of the exit of light rays therefrom with respect to the entrance of the light rays to the first prism.

3. An alignment apparatus according to claim 1, wherein the alignment apparatus in an X-ray aligner system comprising a soft X-ray generator for generating a soft X-ray, a gastight chamber connected at an upper end thereof to the X-ray generator and provided at a lower end thereof with a mask stage for holding the mask, the gastight chamber being filled with a gas, and a wafer table on which the wafer is placed, so as to be opposed to the mask, and wherein the objective, the photodetector, the optical length-varying optical system and the displacement detecting sensor are disposed in the gastight chamber.

4. An alignment apparatus according to claim 1, wherein the at least one prism means includes a pair of prisms being juxtaposed in the optical length-varying optical system, and an inverted prism disposed therebetween for reflecting the light rays so as to enable shifting of the exiting of light rays with respect to the entrance of the light rays.

5. An alignment apparatus according to claim 1, further comprising a jig in which a reflective layer is formed on a substrate, a transparent layer is formed on the reflective layer and optical detection pattern being formed on the transparent layer, is disposed on the mask side of the objective, so as to detect an inclination angle of the optic axis of the objective.

6. An alignmet apparatus according to claim 3, wherein the wafer table on which the wafer is placed is vertically movable, so that the gap between the mask and the wafer is variable.

7. An alignment apparatus according to claim 1, wherein the photodetector includes a linear image sensor arrayed in at least one dimension.

8. An alignment apparatus according to claim 3, wherein the gas filling the gastight chamber is helium.

* * * * *